United States Patent
Liu et al.

(10) Patent No.: US 11,562,942 B2
(45) Date of Patent: Jan. 24, 2023

(54) CHIP-CARRIER SOCKET FOR MICROFLUIDIC-COOLED THREE-DIMENSIONAL ELECTRONIC/PHOTONIC INTEGRATED CIRCUITS

(71) Applicant: Telefonaktiebolaget LM Ericsson (publ), Stockholm (SE)

(72) Inventors: Neng Liu, Montreal (CA); Robert Brunner, Montreal (CA); Stephane Lessard, Mirabel (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 670 days.

(21) Appl. No.: 16/499,589

(22) PCT Filed: Mar. 29, 2017

(86) PCT No.: PCT/IB2017/051806
§ 371 (c)(1),
(2) Date: Sep. 30, 2019

(87) PCT Pub. No.: WO2018/178745
PCT Pub. Date: Oct. 4, 2018

(65) Prior Publication Data
US 2021/0166991 A1    Jun. 3, 2021

(51) Int. Cl.
*H01L 23/473*    (2006.01)
*G02B 6/12*    (2006.01)

(52) U.S. Cl.
CPC ........ *H01L 23/473* (2013.01); *G02B 6/12002* (2013.01)

(58) Field of Classification Search
None
See application file for complete search history.

(56) References Cited

U.S. PATENT DOCUMENTS 4,615,573 A    10/1986    White et al.
10,558,249 B2 *    2/2020    Bose .................. G06F 1/20
(Continued)

FOREIGN PATENT DOCUMENTS

EP    2605345 A1    6/2013
WO    2013086047 A1    6/2013

OTHER PUBLICATIONS

Bar-Cohen, Avram, et al., "DARPA's Intra/Interchip Enhanced Cooling (ICECool) Program", CS Mantech Conference, New Orleans, Louisiana, USA, May 13-16, 2013, pp. 171-174.
(Continued)

*Primary Examiner* — Evren Seven
(74) *Attorney, Agent, or Firm* — Murphy, Bilak & Homiller, PLLC

(57) ABSTRACT

A chip carrier socket for an electronic-photonic integrated-circuit (EPIC) assembly comprises a carrier bottom and a carrier top configured to mate to the carrier bottom while enclosing the EPIC assembly within an enclosed cavity. The carrier bottom comprises one or more conductive vias passing from a first surface of the carrier bottom to an opposite second surface of the carrier bottom, each conductive via providing electrical connectivity between an electrically conductive pad on the first surface of the carrier bottom and a respective electrically conductive pad, solder ball, or electrically conductive spring on the second surface of the carrier bottom. One or both of the carrier bottom and the carrier top comprises a fluid inlet port and a fluid outlet port. Further, either or both of the carrier bottom and the bottom top comprises an optical via passing from one surface to another of the carrier bottom or carrier top.

17 Claims, 10 Drawing Sheets

(56) References Cited

U.S. PATENT DOCUMENTS

| | | | |
|---|---|---|---|
| 11,482,472 B2* | 10/2022 | Eid | H01L 25/0655 |
| 2009/0041466 A1* | 2/2009 | Patel | H04B 10/803 |
| | | | 361/677 |
| 2011/0205708 A1 | 8/2011 | Andry et al. | |
| 2016/0187580 A1 | 6/2016 | Vishkin et al. | |

OTHER PUBLICATIONS

Dang, Bing, et al., "Integrated Microfluidic Cooling and Interconnects for 2D and 3D Chips", IEEE Transactions on Advanced Packaging, vol. 33, No. 1, Feb. 2010, pp. 79-87.

Green, Craig, et al., "A Review of Two-Phase Forced Cooling in Three-Dimensional Stacked Electronics: Technology Integration", Journal of Electronic Packaging vol. 137, Dec. 2015, pp. 1-9.

Kahn, Navas, et al., "3-D Packaging With Through-Silicon Via (TSV) for Electrical and Fluidic Interconnections", IEEE Transactions on Components, Packaging and Manufacturing Technology, vol. 3, No. 2, Feb. 2013, pp. 221-228.

Pangracious, V., "Chapter 2 Three-Dimensional Integration: A More Than Moore Technology", Three-Dimensional Design Methodologies for Tree-based FPGA Architecture, Springer International Publishing Switzerland 2015, 2015, pp. 13-41.

Settaluri, Krishna T., et al., "Demonstration of an Optical Chip-to-Chip Link in a 3D Integrated Electronic-Photonic Platform", ESSCIRC Conference 2015—41st European Solid-State Circuits Conference (ESSCIRC), Sep. 14-18, 2015, pp. 156-159.

Yoo, S. J. Ben, et al., "Heterogeneous 2D/3D photonic integrated microsystems", Microsystems & Nanoengineering (2016) 2, 16030; doi:10.1038/micronano.2016.30, Apr. 2016, pp. 1-9.

* cited by examiner

CHIP-CARRIER SOCKET FOR MICROFLUIDIC-COOLED THREE-DIMENSIONAL ELECTRONIC/PHOTONIC INTEGRATED CIRCUITS

TECHNICAL FIELD

The present disclosure is generally related to three-dimensional packaging of integrated circuits (ICs), and is more particularly related to three-dimensional integrated photonic-electronic IC assemblies.

BACKGROUND

Today's data centers typically comprise numerous server racks, each with many pluggable boards that together carry large numbers of core memories and processors. These boards are connected to one another by electrical or optical cables, which can limit the communication bandwidth between high-speed processors and memory. To address these issues in high-performance data centers, vertically stacked, three-dimensional (3D), packaging of these chips has been demonstrated to be a good solution which can reduce the interconnect path and interconnect delay to/from the memory layer. Therefore, several 3D electronic and 3D photonic systems have been developed, over the past decade.

One key issue slowing the trend toward ever-faster and denser storage and processing solutions is the delays caused by electronic circuit interconnects. These delays are due to the increasing number of interconnects, with more resistive, thinner, wires and increased wire-to-wire capacitance arising from the closer spacing between the interconnects. One approach to reduce these delays is to vertically stack electronic circuits in three dimensions, as compared to traditional integrated circuits and multi-chip modules (MCMs) that utilize design layouts in two dimensions (2D). The results of this vertical stacking may be referred to as a "3D Electronic Integrated Circuit," or "3D-EIC," an example of which is illustrated in FIG. 1.

As seen in FIG. 1, IC dies carrying different functions of a chip-level circuit, such as a memory layer, a processor layer, and an analog layer, can be stacked vertically, on a substrate, to create a heterogeneous integration of electronic ICs. As shown in the figure, the layers (i.e., the individual IC dies) are interconnected by through-silicon vias (TSVs) or micro-bumps. The 3D-EIC approach not only increases the density and performance of the electronic circuit, but also reduces the length of interconnects, which in turn reduces wire delays and power losses. With a tiny footprint, low power consumption, exceptional speed, circuit security and several other advantages, 3D-EIC provides the paradigm for developing a broader set of electronic products. 3D-EICs are described in Pangracious, V., Z. Marrakchi, and H. Mehrez, *Three-Dimensional Integration: A More Than Moore Technology*, in *Three-Dimensional Design Methodologies for Tree-based FPGA Architecture*. 2015, Springer International Publishing: Cham. pp. 13-41. Through-silicon vias are described in Khan, N., et al., *3-D Packaging with Through-Silicon Via (TSV) for Electrical and Fluidic Interconnections*, IEEE Transactions on Components, Packaging and Manufacturing Technology, 2013 3(2), pp. 221-228.

Temperature management is an important challenge in IC design in general, and becomes a more serious issue in 3D-EIC designs, due to the increasing power flux resulting from 3D stacking. This issue is discussed, for example, in Bar-Cohen, A., J. J. Maurer, and J. G. Felbinger, *DARPA's Intra/Interchip Enhanced Cooling (ICECool) Program*, in *CS MANTECH Conference*, May 13th-16$^{th}$, 2013. Attaching a heatsink, an approach that is widely used with traditional 2D electronic integrated circuits, can only effectively remove the heat from the top or bottom layer of a 3D EIC. The heat from other layers, which are sandwiched between electronic isolation layers made of passive $SiO_2$, is blocked, and can cause very high temperatures inside the 3D assembly.

Microfluidic cooling is a promising technique that can be used to remove heat from a 3D EIC. Microfluidic cooling can be used to scale down the cooling heat sink size, or eliminate the need for a hint sink entirely. FIG. 2 illustrates an example of a 3D EIC that is provided with microfluidic cooling. As seen in the figure, several IC dies are stacked, and attached to a carrier 210. However, several channels or passages 220 are provided between the stack of IC dies and the carrier 210, with these channels or passages being sized and suitable for the passage of fluids. Cooling liquid can be supplied to the channels or passages 220 via a cooling liquid inlet 230, and is removed via a cooling liquid outlet 240.

An interlayer microfluidic channel for cooling 3D EICs was demonstrated in 2007. A so-called two-phase cooling interlay has attracted great attention due to its advantages in reduced coolant flow rate and pump power when dissipating the same heat, as compared to single phase cooling. Also, this approach offers great temperature uniformity throughout the chips. This technology is described in Green, C., et al., *A Review of Two-Phase Forced Cooling in Three-Dimensional Stacked* Electronics: Technology Integration. Journal of Electronic Packaging, 2015. 137(4): p. 040802.

As the trend of electronic circuit packaging moves from monolithically 2D to 3D integration, there is an increasing interest in 3D integration of photonics integrated circuits (PICs), in addition to the ongoing development of monolithic 2D PICs. This is discussed, for example, in Yoo, S. J. B., B. Guan, and R. P. Scott, *Heterogeneous 2D/3D photonic integrated microsystems*, Microsystems & Nanoengineering, 2016, 2: p. 16030. With 3D-PICs, different 2D-PIC layers are vertically stacked together, using micro-bumps, wafer-bonding, and epitaxy. Optical interconnects between IC die layers can be accomplished using optical TSV, vertical waveguides, periodic photonic crystal structures, and vertically hybrid active materials or photonic devices applied onto a silicon passive photonic platform.

The next step in increased integration is the 3D Electronic Photonic Integrated Circuit (EPIC), which represents a chip-scale integration of an EIC and PIC. The EPIC is expected to be more cost effective, reliable, and highly integrated, which can address communication problems in future data centers that are not solvable by electronics or photonics alone. An EPIC is described in Settaluri, K. T., et al. *Demonstration of an optical chip-to-chip link in a 3D integrated electronic-photonic platform*. in *European Solid-State Circuits Conference (ESSCIRC), ESSCIRC* 2015-41$^{st}$, 2015.

SUMMARY

A key problem with a 3D EPIC stack is thermal management. Vertically stacked layers increase the power density from pin-to-pin and the stacked dielectric intra-layers increase the thermal resistance of the stacked EPIC. Another key issue is the lack of designs for suitable packages for 3D ICs, especially 3D EPICs that utilize liquid cooling.

Described herein are chip carrier sockets and related assemblies that address these problems.

According to several of the embodiments described herein, a chip carrier socket for an EPIC assembly comprises a carrier bottom and a carrier top, where the carrier top is configured to mate to the carrier bottom while enclosing the EPIC assembly within an enclosed cavity formed by the mating of the carrier top and carrier bottom. The carrier bottom comprises one or more conductive vias passing from a first surface of the carrier bottom to an opposite second surface of the carrier bottom, each of the conductive vias being configured to provide electrical connectivity between an electrically conductive pad on the first surface of the carrier bottom and a respective electrically conductive pad, solder ball, or electrically conductive spring on the second surface of the carrier bottom. One or both of the carrier bottom and the carrier top comprises a fluid inlet port and a fluid outlet port, the fluid inlet port and fluid outlet port each being configured to allow passage of cooling fluid between the interior and exterior of the enclosed cavity formed by the mating of the carrier top and carrier bottom. Further, either or both of the carrier bottom and the bottom top comprises an optical via passing from one surface to another of the carrier bottom or carrier top.

According to some other embodiments disclosed herein, a printed circuit board assembly provides an integrated chip carrier socket for an electronic-photonic integrated-circuit assembly. The printed circuit board assembly comprises a carrier bottom integrated into a printed circuit board and comprises one or more conductive vias passing from a first surface of the carrier bottom to corresponding electrical traces in or on the printed circuit board, and a carrier top configured to mate to the carrier bottom while enclosing the electronic-photonic integrated-circuit assembly within an enclosed cavity formed by the mating of the carrier top and carrier bottom. One or both of the carrier bottom and the carrier top comprises a fluid inlet port and a fluid outlet port, the fluid inlet port and fluid outlet port each being configured to allow passage of cooling fluid between the interior and exterior of the enclosed cavity formed by the mating of the carrier top and carrier bottom. One or both of the carrier bottom and the carrier top comprises an optical via passing from one surface to another of the carrier bottom or carrier top.

Several variations of the above-summarized devices and methods are detailed below and illustrated in the attached figures.

DETAILED DESCRIPTION

Figure 1:
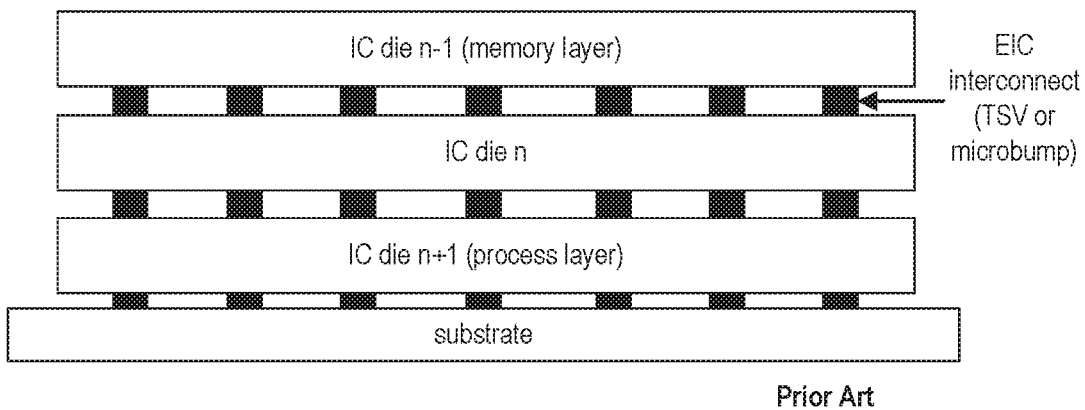
FIG. 1 illustrates an example 3D electronic integrated circuit (EIC).
Figure 2:
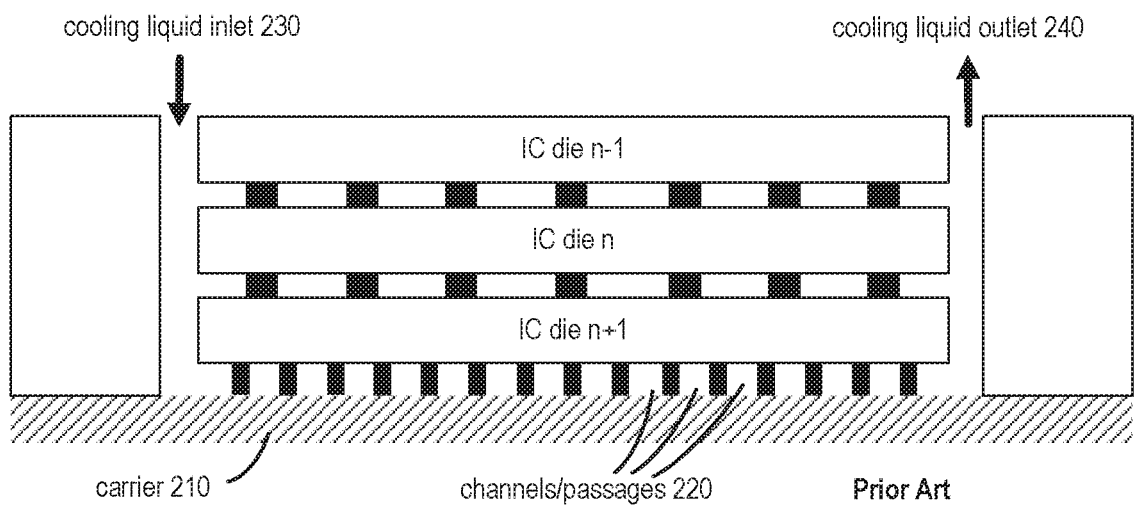
FIG. 2 illustrates a 3D EIC with microfluidic cooling.

As discussed in the Background section above, a next step in increased integration of IC dies is the 3D-EPIC, which represents a chip-scale integration of one or more EICs and one or more PICs. A key problem with 3D EPIC stacks, however, is thermal management, since the vertically stacked layers increase the power density from pin-to-pin and the stacked dielectric intra-layers increase the thermal resistance of the stacked EPIC.

3D EPIC stacks address these problems by shortening the interconnect lengths, which are the main cause of the thermal problem. The electronic and photonic chip layers can be integrated with each other by direct wafer bonding or epitaxy, instead of using micro-bumps. The active region, e.g., III-V material or Germanium (Ge), can be grown on the silicon wafer, followed by micro/nanofabrication of the active photonic devices using standard foundry techniques and practices. Through-wafer interconnects (TWIs) or through-wafer vias can be used to interconnect between one electronic layer and another electronic layer, or between an electronic layer and a photonic layer.

A second aspect of the 3D EPIC involves reducing or eliminating energy-inefficient copper connectivity between neighboring functional blocks, e.g. core-to-core processors and memory, on both the same and different IC die planes (layers), whether in one or in several stacked 3D-EPIC units. Vertical optical interconnectivity in a 3D-EPIC between the different photonic layers/stacks can be resolved with the utilization of 3D photonic crystal structures, vertical waveguides, and/or optical TWVs.

A third aspect is related to high-efficiency thermal heat extraction from a 3D-EPIC, which is done by employing micro/nano-fluidic channel cooling to the EPIC circuit block. The microfluidic coolant circuit includes microfluidic channels in the substrate layer and microfluidic vias, which may traverse multiple different layers. The microfluidic channels in the substrate can be fabricated through a micro-pin-fin technique, for example, where the substrate is then bonded to a glass base. A forced two-phase microfluidic flow system can then be used to cool the EPIC system, in some embodiments. Note that "microfluidics" should be understood to refer to the science and technology of manipulating and controlling fluids, e.g., in the range of microliters to picoliters, in networks of channels with lowest dimensions ranging from several to several hundreds of micrometers. Thus a "microfluidic channel" is a channel or passage having dimensions on this order and which is suitable for transporting fluids in quantities of this range. "Nanofluidics" may be understood as referring to similar technology, but involving dimensions in nanometer scale and quantities one to three orders of magnitude below those for microfluidic technologies.

As will be discussed in further detail below, these microfluidic-cooled EPIC units can be stacked vertically, or laid out in 2D/3D arrays, to provide complex and highly integrated EPIC assemblies. Advantages of the basic building block of a stackable 3D-EPIC described herein, sometimes referred to herein as a 3D-EPIC unit, include that these 3D-EPIC units facilitate the integration of the following elements in an EPIC: optical connectivity for all intra/inter-chip signaling, copper connectivity for only power distribution, and die level cooling. The solutions described herein include a novel modularity scheme to enable the scaling of an EPIC system capable of supporting millions of processor cores in an IC chip package. The 3D-EPIC unit can be scaled in a multitude of arrangements, such as in a 3D-EPIC stack, a 2.5D array of EPIC units, or a 3D array of EPIC units. These solutions can enable the highest density computing with the lowest power consumption, while permitting flexible integration through the use of compatible Complementary metal-oxide-semiconductor (CMOS) foundry processes for both EIC and PIC fabrication.

The design of a carrier for stacked chips is vital to the efficient functioning of the chips. A properly designed carrier can provide interconnections between 3D chips and their interfacing environments. In the past decades, substantial research has been devoted to integrated 2D/3D electronic circuit packaging technologies where advanced approaches have been developed. However, for microfluidic systems and 3D PICs, the carrier or package techniques used are still in its infancy and not standardized because of the many issues that are required to be resolved. There are still new challenges for the 3D packages, e.g. liquid interconnection, for the new 3D EPIC chips.

Figure 3:
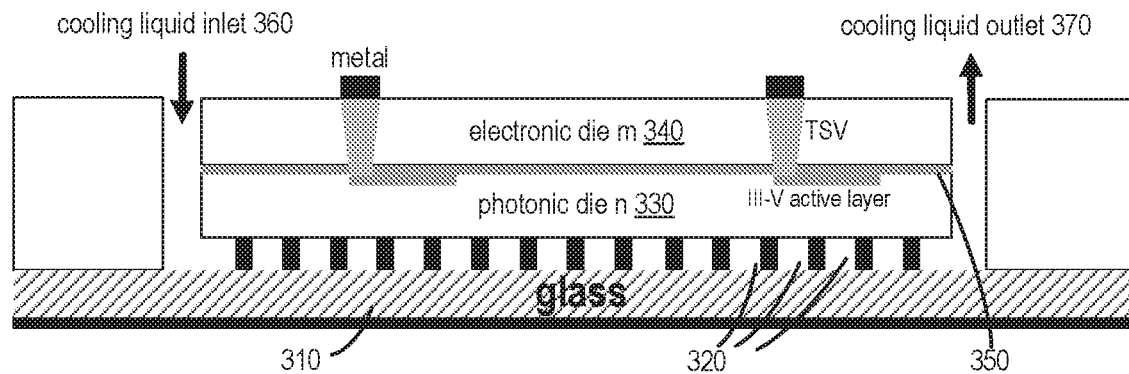
FIG. 3 illustrates an example microfluidic 3D electronic-photonic integrated circuit (EPIC) unit that contains one electronic die on top of one photonic die.

To provide background and context for the detailed discussion of the packaging solutions described below, the general microfabrication process of a 3D-EPIC unit according to some example embodiments of the presently disclosed techniques will be first described. A 3D-EPIC unit that contains an electronic layer on top of a photonic layer, as shown in FIG. 3, will be taken as an example. It will be appreciated that while FIGS. 3, 4, 5, and 6 each show a single EPIC unit, for simplicity, the processes discussed below may be applied at the wafer level, such that many EICs and PICs are fabricated and processed at the same time. Further, it will be appreciated that while specific fabrication and assembly techniques are described here, the packaging solutions described below may be used with EPICs that are fabricated and assembled using other techniques as well.

To produce a 3D-EPIC unit like the one shown in FIG. 3, the backside of a substrate wafer is first etched, to form one or microfluidic channels or passages 320 on the wafer's backside. A glass wafer 310 or other carrier substrate is then bonded to the processed substrate layer, to seal the microfluidic channels. On the top surface of the substrate layer, i.e., opposite the surface bonded to the glass wafer, III-V and germanium active layers are selective-area grown, along with micro/nanofabricated features, to form a photonic integrated circuit (PIC) 330, which is capped with a passivation oxide layer and metallized contacts.

A separate wafer is used to fabricate the EIC 340, e.g., using conventional CMOS processes. The EIC wafer is bonded to the assembly that includes the PIC and the glass substrate, e.g., using a silicon oxide bonding layer 350 between the PIC 330 and the EIC 340. Lastly, a cooling liquid inlet port 360 and outlet port 370 are dry- or wet-etched through these stacked 3D-EPIC multilayers, while metals and conductive TSVs are fabricated to conduct external electrical power to the 3D-EPIC unit. The bonded wafers discussed above comprise a crystal silicon wafer and a silicon wafer with silicon-on-insulator (SOI) on top.

Figure 4:
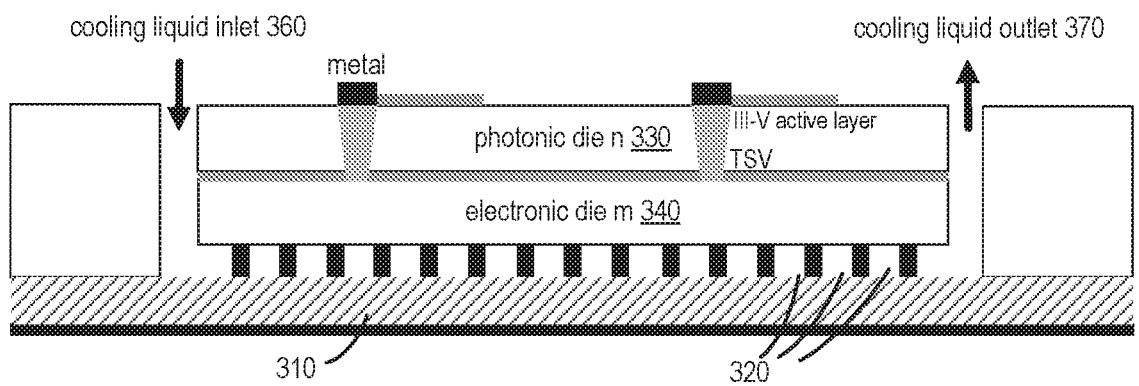
FIG. 4 illustrates an example microfluidic 3D-EPIC unit that contains one photonic die on top of one electronic die.

Other embodiments of 3D-EPIC "units" can be fabricated, as noted in the following examples, using similar steps as described above. For instance, while the 3D-EPIC unit shown in FIG. 3 has the electronic die 340 on top of the photonic die 330 (where "top" refers to an external surface opposite the glass carrier 310), other embodiments may have the photonic die 330 on top of the electronic die, as shown in FIG. 4.

Figure 5:
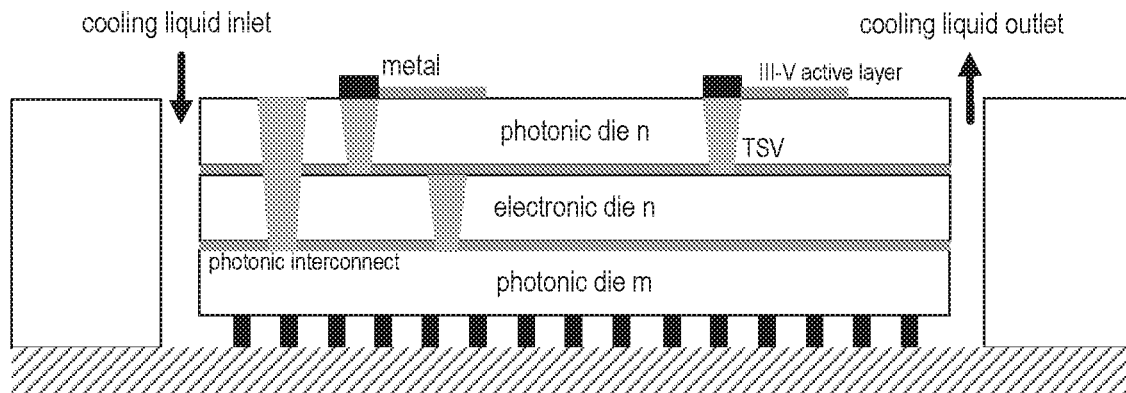
FIG. 5 illustrates an example 3D-EPIC unit that includes two photonic dies and an electronic die.

In other embodiments, one or more electronic dies can be sandwiched between two photonic dies, as shown in FIG. 5. In this 3D-EPIC system, a through-wafer interconnect (TWI) can be used as a photonic interconnect, to transmit optical signals from the top photonic layer to the bottom photonic layer.

Figure 6:
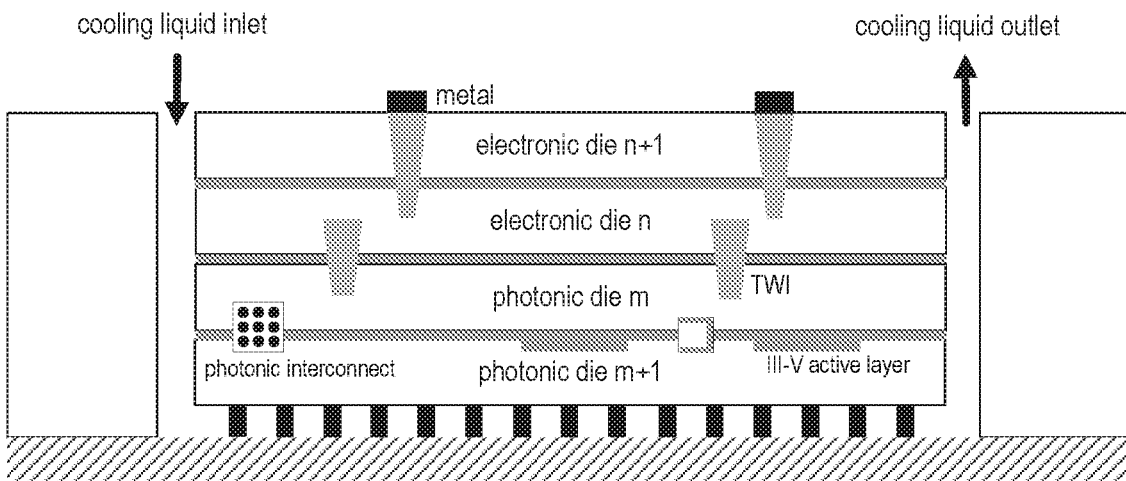
FIG. 6 shows an example 3D-EPIC unit that includes two electronic dies and two photonic dies.

Other stacks, with even more layers, are possible. FIG. 6, for example, shows a unit in which two electronic die layers (e.g., a memory layer and a processor layer) are grown or otherwise assembled on top of two photonic layers. Photonic and electronic TWIs can be used to transmit the signals. In the case of a photonic interconnect, 3D optical waveguides and/or photonic crystals can be used to transmit the optical signals. These 3D photonic structures can be fabricated through standard foundry processes, or using femtosecond (Fs) laser lithography. A Fs laser can be used to induce nano-hydrophilic defect lines, in some embodiments, where these nano-hydrophilic defect lines can be used to absorb chilled coolant, to enhance the cooling effect in a multi-layered 3D-EPIC unit, such as a unit comprising four or more layers.

Figure 7:
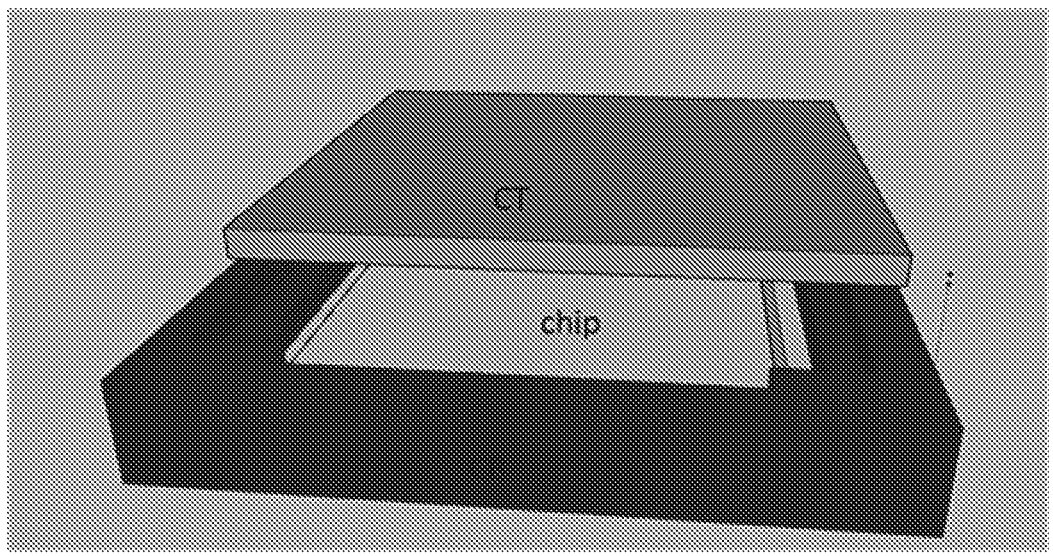
FIG. 7 provides a perspective view of an example 3D chip carrier socket for a stacked 3D microfluidic EPIC.

FIG. 7 is a perspective view of an example 3D chip carrier socket for a stacked 3D microfluidic EPIC, e.g., as assembled according to any of the above examples. This chip carrier socket, which may be referred to as a chip carrier socket—EPIC, or CCS-E, comprises two parts, the carrier bottom (CB), which serves as the chip "socket" and/or fluidic container, and the carrier top (CT), which serves as the cover. The chip is mounted on the surface of the CB, and then covered by the CT using a compression fit (spring loaded).

Although the carrier bottom is shown as having the shape of a container, in other embodiments the side walls could be an integral part of the carrier top and the carrier bottom could be planar.

Continuing with the example embodiment of FIG. 7, once an EPIC is placed within the socket provided by the carrier bottom, the carrier top and carrier bottom may be affixed together using any conventional mechanical means, such as one or more clasps, screws, etc. One or more through-silicon vias (TSVs) or through-carrier vias (TCVs) can be used to establish electrical connectivity from the printed circuit board (PCB) to which the chip carrier socket is mounted to any of the upper elevations within the chip carrier socket, i.e., to the carrier bottom, and/or to the 3D-EPIC chip itself, and/or to the carrier top. The chip carrier socket may be mounted to the PCB using a ball grid array (BGA) of solder balls if reflow attached, or by an array of springs if compression mounted to the PCB.

Figure 8:
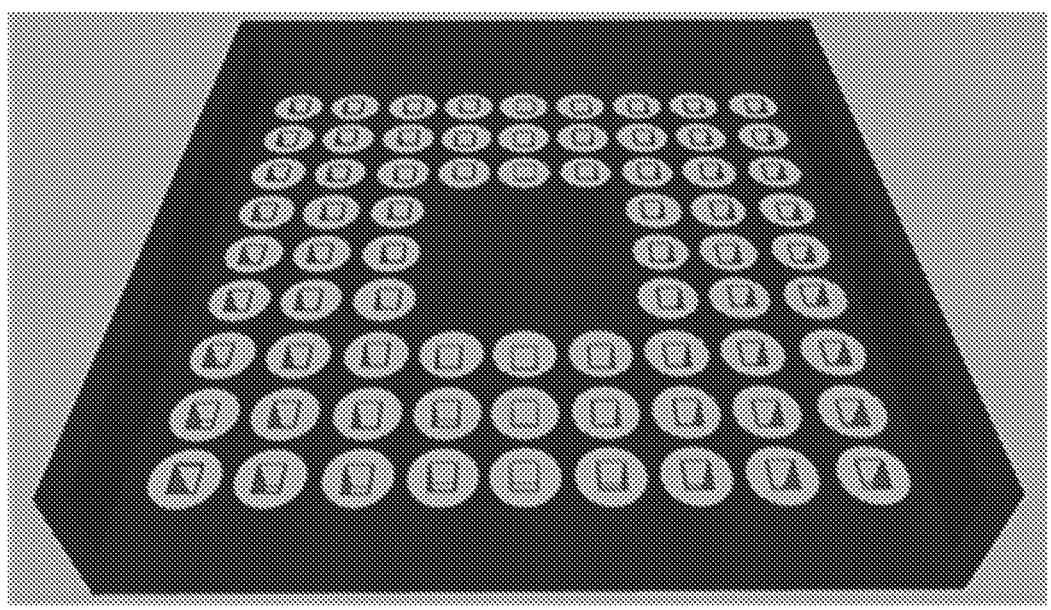
FIG. 8 shows details of an example carrier bottom for a 3D EPIC chip carrier socket.

In some embodiments, the carrier top and carrier bottom are made of thermally conductive material fabricated using standard injection molding or other specialized fabrication processes. Other suitable packaging may be used, in other embodiments. In some embodiments, the carrier bottom may provide electrical and/or optical connectivity to the EPIC housed by the socket using a layout structure similar to a land grid array (LGA) socket, as shown in FIG. 8. The slot (circles) provides holes or via for optical and electrical interconnects between the chip and CCS-E. This LGA layout provides precise position alignment during chip mounting, and is convenient for the replacement or upgrade of 3D-EPIC chips mounted on an O-PCB. It will also be appreciated that this layout may accommodate chips of various sizes and with various numbers of contact pins on carrier bottom substrates, making the chip carrier socket usable with a variety of EPICs.

Figure 9:
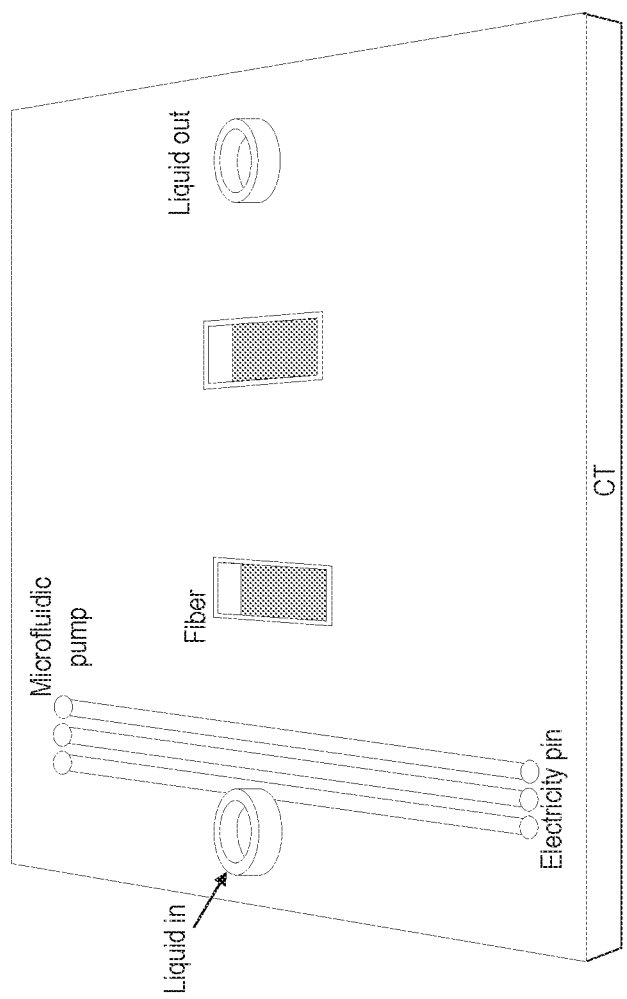
FIG. 9 shows details of an example carrier top for a 3D EPIC chip carrier socket.

In various embodiments, the carrier top can provide any one or more of liquid inlet and outlet ports, optical interconnections, and electrical interconnections. All three are illustrated in the example carrier top shown in FIG. 9, which includes circular inlets/outlets for liquid flow, conductive metal pads and TCVs for electrical interconnections, and fiber slots for optical signals. To allow liquid coolant to flow continuously in the microfluidic channels within the chip carrier socket and/or within the EPIC, a replaceable low-profile microfluidic pump (pneumatic, hydraulic, electrostatic, etc.) can be attached to the carrier top. In some embodiments, the electrical interconnects provided through the carrier top carry electrical power to the microfluidic pump.

Figure 10:
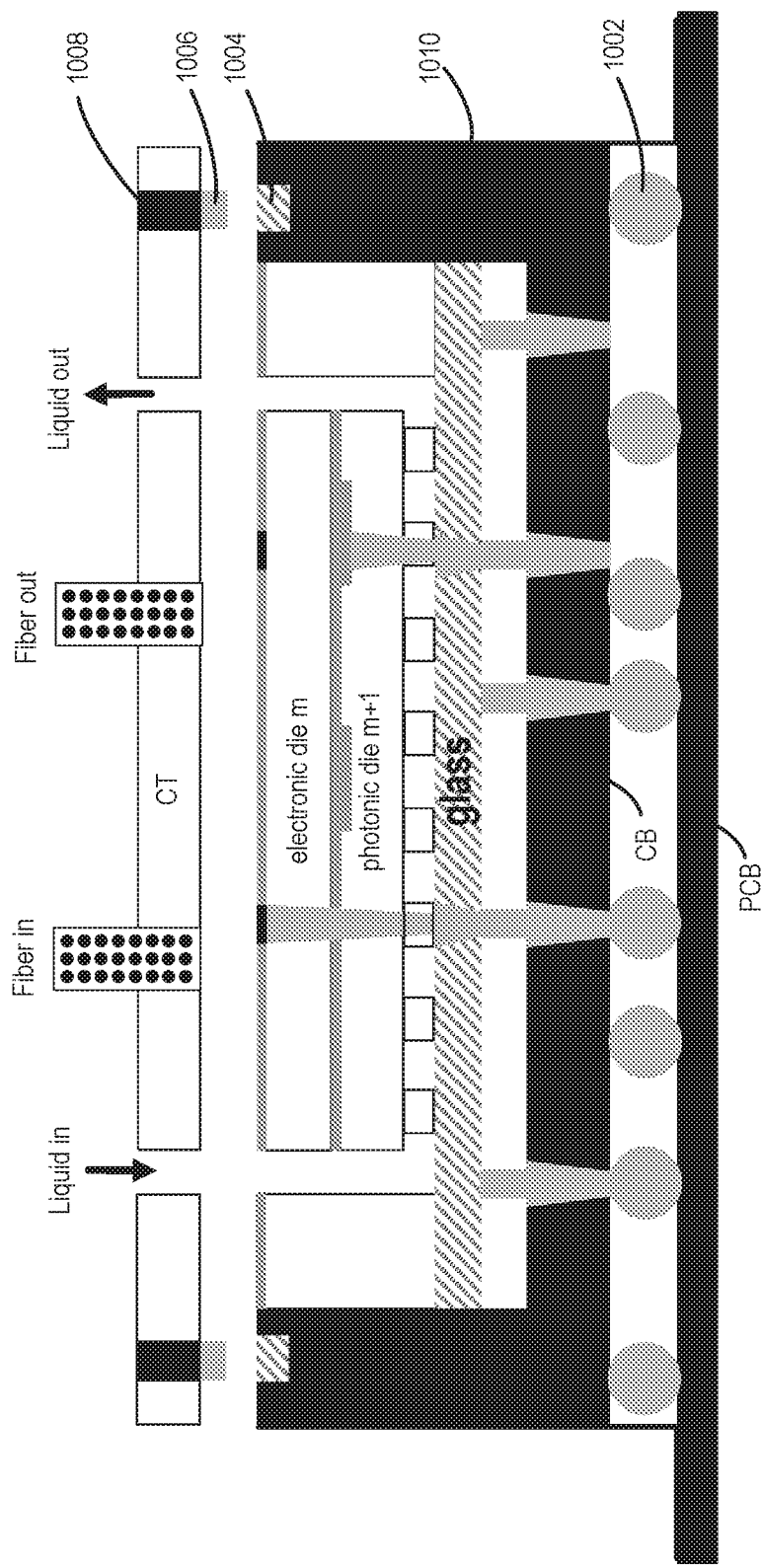
FIG. 10 illustrates a cross-sectional view of an example chip carrier socket housing a stacked microfluidic 3D EPIC.
Figure 11:
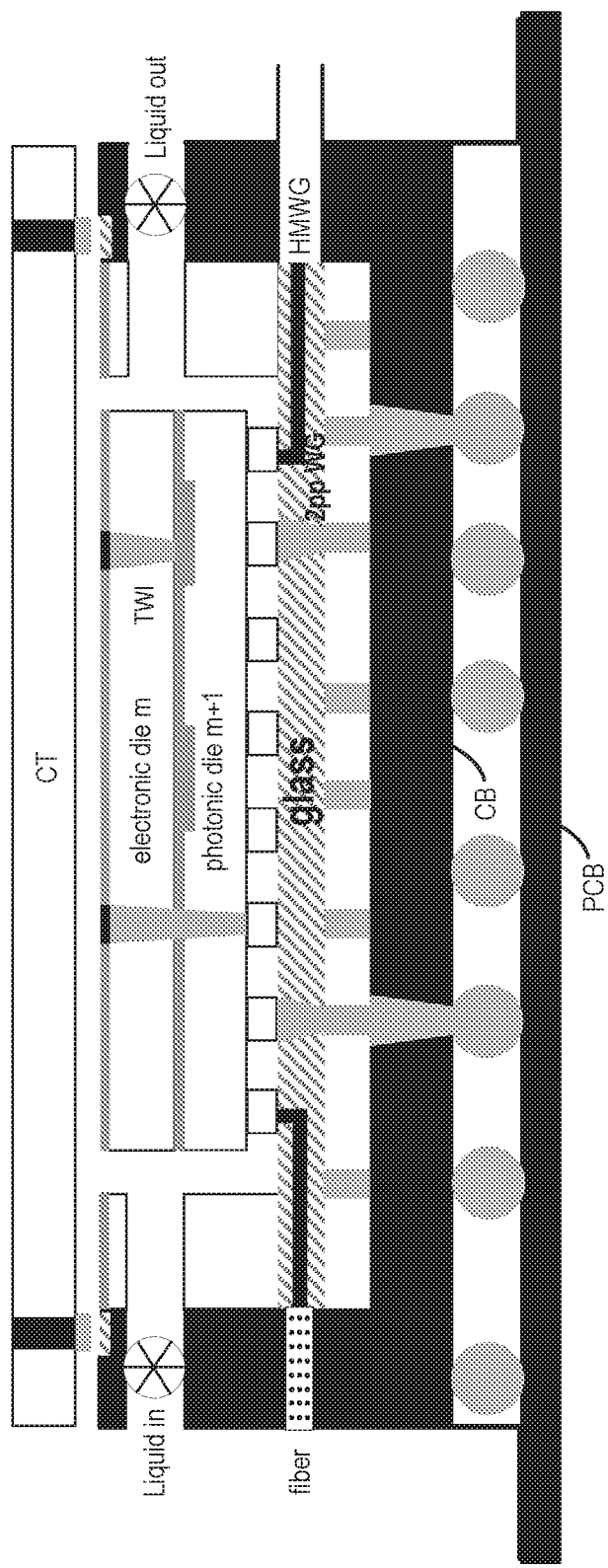
FIG. 11 illustrates a cross-sectional view of another example chip carrier housing a stacked microfluidic 3D EPIC.
Figure 12:
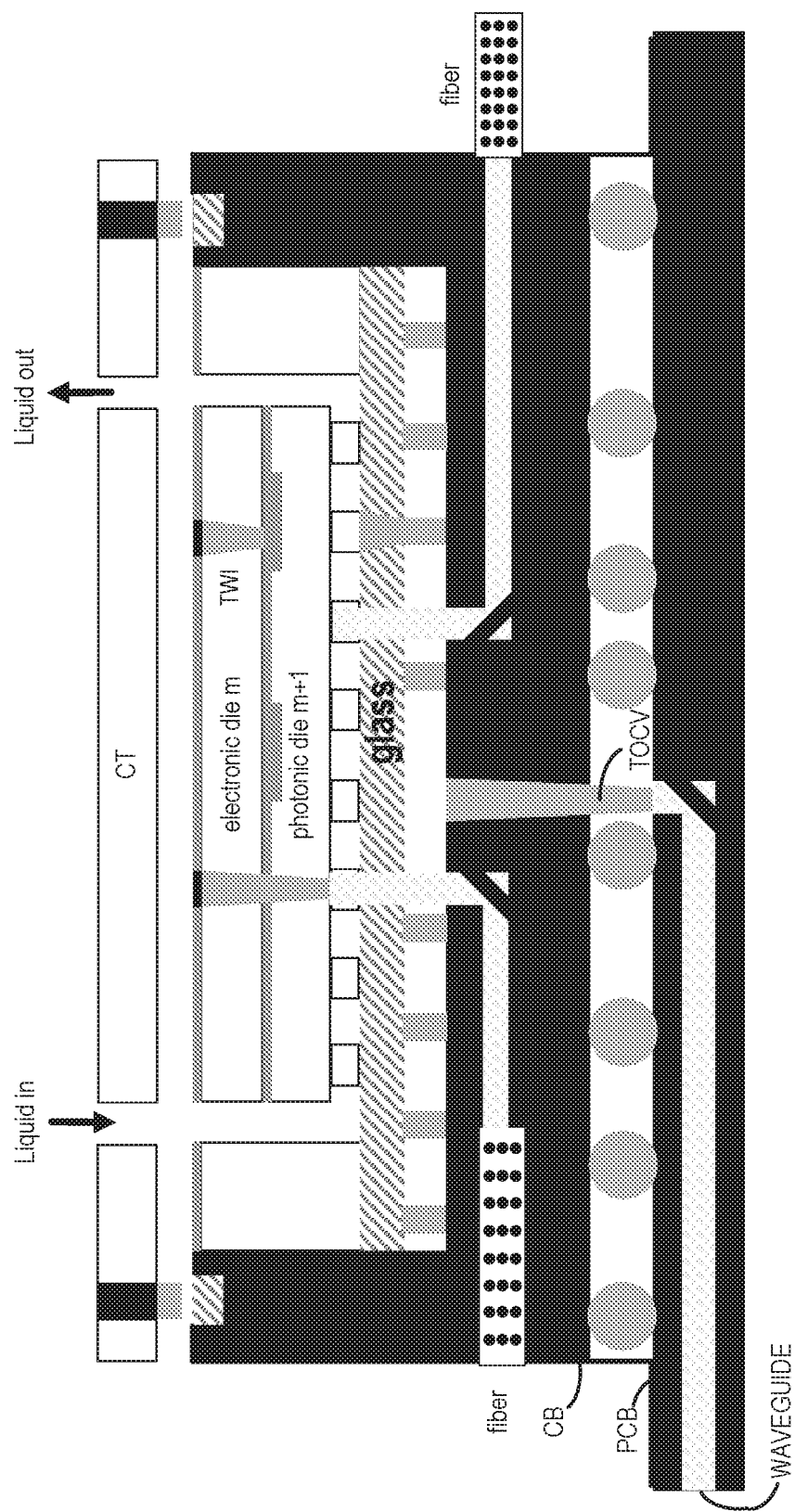
FIG. 12 illustrates a cross-sectional view of still another example chip carrier housing a stacked microfluidic 3D EPIC, in this case mounted on an optical printed circuit board.

The specific design of the chip carrier socket for housing EPICs may vary, depending on the kinds of optical, electrical, and liquid inlets/outlets being used. FIGS. 10, 11, and 12 illustrate cross-sectional views for three example chip carrier socket designs. It will be appreciated that features from any of these designs may be mixed-and-matched, as needed, to provide further variants.

FIG. 10 illustrates a cross-sectional view of the stacked carrier top, semiconductor chip and carrier bottom in one example design. In this example, optical, liquid, and electrical interconnections are all fabricated in the carrier top. The bottom surface of the carrier bottom has a plurality of solder bumps 1002 (or contact springs), which are used to seat the chip carrier socket on the PCB and provide electrical connectivity. The carrier top and carrier bottom are mated to one another with a metal contact pad 1004 and a plug 1006, which is spring-loaded 1008. TCVs can be micro-fabricated in this region of carrier top for the electrical control of the microfluidic pump in carrier top. Optionally, for compactness, a conductive wire 1010 along carrier bottom is used to connect the electrical power contact pad 1004 with the PCB. Also, there are fiber slots fabricated in the carrier top, for optical transmission, and a liquid inlet and outlet are also provided, for coolant circulation. The TCVs, fiber I/O and liquid I/O sites can all be fabricated using existing manufacturing processes.

FIG. 11 illustrates a cross-sectional view of another design for an EPIC chip carrier socket. In this example, external coolant at static pressure is pumped into the chip carrier socket by micro-pumps attached to the chip carrier socket walls, thus forcing coolant to circulate through the 3D-EPIC. The 3D-EPIC, which in itself is an optical network of thousands of optical waveguides, interfaces to the chip carrier socket, which in turn interfaces to external optical fibers through optical vias, e.g., by V-grooves fabricated inside the CCS-E's wall.

Other variants of optical waveguide that can be included in the chip carrier socket include the "hollow metal waveguide" (HMWG) and "dielectric filled HMWG", which can accommodate photonic, plasmonic, and RF signaling. In FIG. 11, a HWMG is shown passing through one side wall of the chip carrier bottom, while a fiber-filled optical via passes through another side wall.

With respect to the optical vias, femtosecond (Fs) laser-induced grating or photonic crystal can be fabricated inside glass to improve the coupling coefficient. Also, hollow waveguides can be fabricated through the carrier wall, by depositing a continuous layer of metal and dielectric layer. These V-grooves and hollow waveguides can be fabricated by etching of the carrier mold or by 3D multilayer printing. In some embodiments, the wall of the carrier is coated with a film of waterproof adhesive material, to seal the gap between the chip and carrier, and then heat cured. Electrical interconnections are provided by the LGA and electrical traces embedded in the body of the chip carrier socket.

FIG. 12 illustrates yet another example design. In this example, mirrors and optical waveguides are fabricated inside carrier bottom, e.g., using multilayer fabrication techniques. An optical signal is transmitted from the 3D-EPIC to the carrier bottom by a "Through Optical Chip Via" (TOCV) and then reflected into an optical waveguide embedded in the carrier bottom. External optical fiber can be interfaced to the CCS-E with perfect alignment by utilizing a V-groove ferrule embedded in the carrier bottom. In the illustrated example, the V-groove ferrule provides an optical via to a side wall of the carrier bottom.

Figure 13:
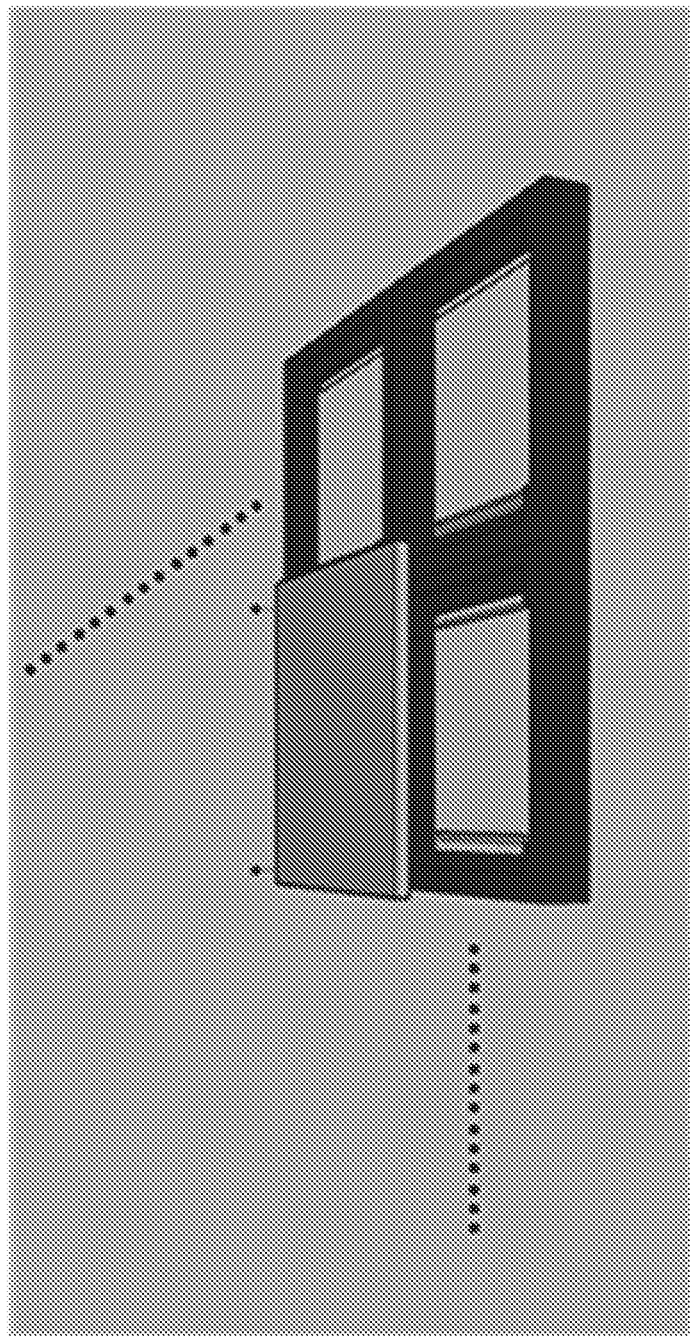
FIG. 13 shows multiple chip carrier sockets integrated onto a single printed circuit board.

Above, several different ways of providing optical, electrical, and liquid interconnections have been described separately, in three CCS-E design examples. Again, it should be understood that the various interconnections shown in these figures may be mixed-and-matched, in various embodiments. It will also be appreciated that several of the chip carrier sockets described herein may be used together. To support high densities of 3D-EPICs mounted onto an optical PCB (O-PCB), for example, a "CCS-E array" can be fabricated using the same methods described above for a single chip CCS-E. An example of such a CCS-E array is shown in FIG. 13.

Figure 14:
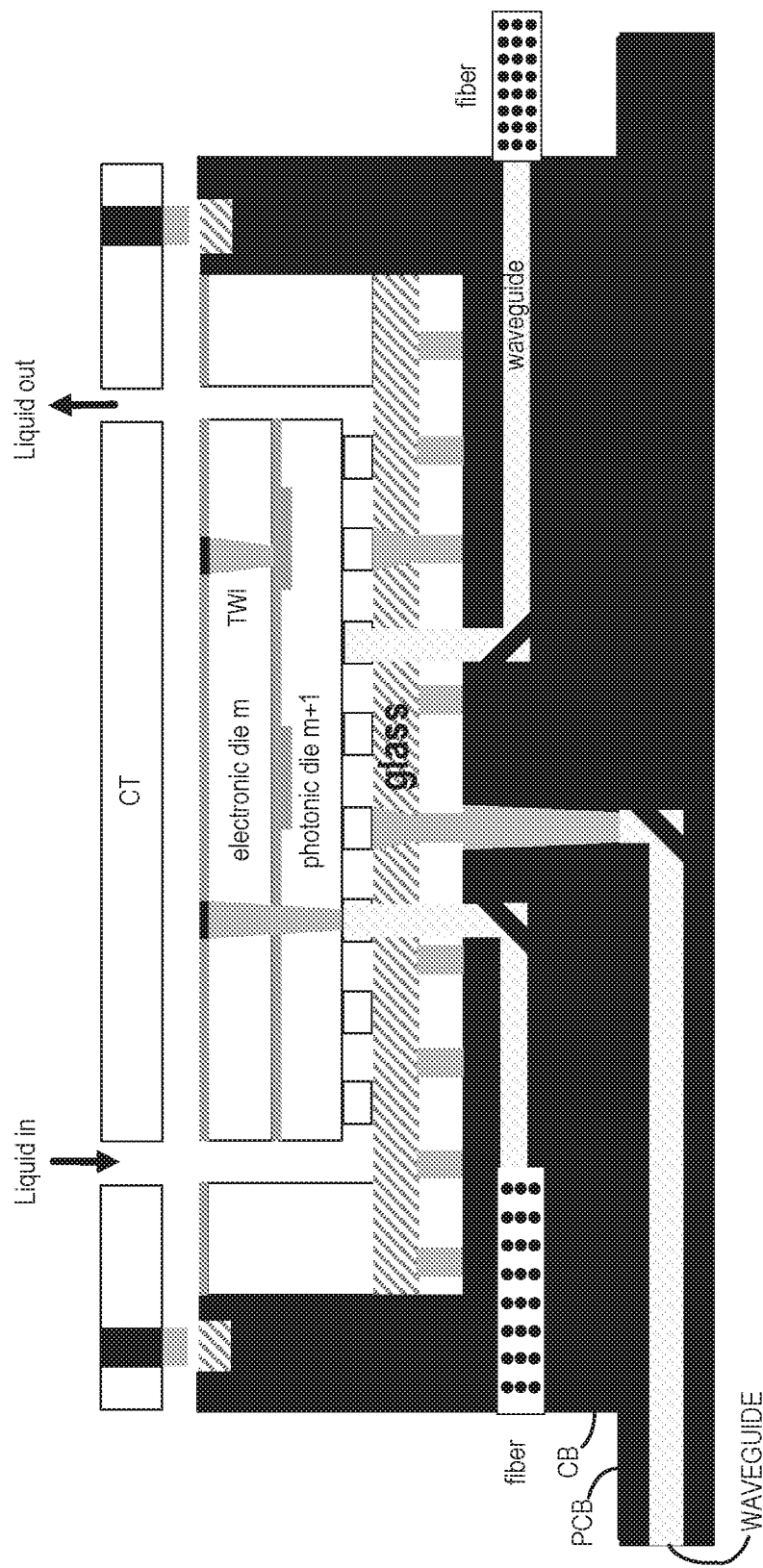
FIG. 14 illustrates a cross-sectional view of a chip carrier socket integrated into an optical printed circuit board.

In the examples described above, the chip carrier socket comprises a carrier top and a carrier bottom, where the carrier bottom is configured to be mounted to a PCB. In a variant of this approach, the carrier bottom may be integrated with the PCB itself, e.g., by using multilayer fabrication techniques to fabricate the carrier bottom as a part of the PCB. FIG. 14 shows an example of this approach, where optical signals can be transmitted using TCV, mirrors, and waveguides formed inside the PCB.

In view of the several example devices described above and illustrated in the figures, it will be appreciated that embodiments of the presently disclosed invention include a chip carrier socket for an EPIC assembly, where the chip carrier socket comprises a carrier bottom and a carrier top, the carrier top being configured to mate to the carrier bottom while enclosing the EPIC assembly within an enclosed cavity formed by the mating of the carrier top and carrier bottom. The carrier bottom comprises one or more conductive vias passing from a first surface of the carrier bottom to an opposite second surface of the carrier bottom, each of the conductive vias being configured to provide electrical connectivity between an electrically conductive pad on the first surface of the carrier bottom and a respective electrically conductive pad, solder ball, or electrically conductive spring on the second surface of the carrier bottom. One or both of the carrier bottom and the carrier top comprises a fluid inlet port and a fluid outlet port, the fluid inlet port and fluid outlet port each being configured to allow passage of cooling fluid between the interior and exterior of the enclosed cavity formed by the mating of the carrier top and carrier bottom. Further, either or both of the carrier bottom and the bottom top comprises an optical via passing from one surface to another of the carrier bottom or carrier top.

In some embodiments, a conductive contact on the carrier top is configured to engage a corresponding conductive contact on the carrier bottom when the carrier top is mated to the carrier bottom, and the corresponding conductive contact on the carrier bottom is conductively connected to a pad, solder ball, electrically conductive spring, or conductive lead, on or adjacent to the second surface of the carrier bottom. This conductive contact on the carrier top may comprise a spring-loaded, electrically conductive plug, for example.

In some embodiments, the carrier top comprises a fluid inlet port and a fluid outlet port, the fluid inlet port and fluid outlet port of the carrier top being configured to allow passage of cooling fluid between the interior and exterior of the enclosed cavity formed by the mating of the carrier top and carrier bottom. An example of these embodiments is shown in FIG. 10, as discussed above. In these embodiments, the fluid inlet port and fluid outlet port of the carrier top may be arranged to align with corresponding fluid inlet and outlet ports on the electronic-photonic integrated-circuit assembly, when the electronic-photonic integrated-circuit assembly is enclosed within the enclosed cavity formed by the mating of the carrier top and bottom.

In some embodiments, the carrier bottom comprises a fluid inlet port and a fluid outlet port configured to allow passage of cooling fluid between the interior and exterior of the enclosed cavity formed by the mating of the carrier top and carrier bottom. In some of these embodiments, the fluid inlet port and fluid outlet port of the carrier bottom are arranged to align with corresponding fluid inlet and outlet ports on the electronic-photonic integrated-circuit assembly, when the electronic-photonic integrated-circuit assembly is enclosed within the enclosed cavity formed by the mating of the carrier top and bottom. This is shown, for example, in FIG. 11, as discussed in detail above.

Any of the embodiments discussed above may further comprise a microfluidic pump coupled to the carrier top or carrier bottom and in fluid connection with a fluid inlet port or fluid outlet port. In some of these embodiments, the microfluidic pump is replaceably removable from the carrier top or carrier bottom, where "replaceably removable" means that the microfluidic pump can be removed and replaced without damage to the chip carrier top or bottom, so that the chip carrier socket can continue to be used or be re-used, with the replacement pump.

In some of the embodiments discussed above, the carrier top comprises an optical via passing from a first surface of the carrier top to a second surface of the carrier top and arranged to couple to an optical port on the electronic-photonic integrated-circuit assembly, when the electronic-photonic integrated-circuit assembly is enclosed within the enclosed cavity formed by the mating of the carrier top and bottom.

In some embodiments, the carrier bottom comprises an optical via passing from one surface of the carrier bottom to another surface of the carrier bottom. For instance, an optical via may pass from the first surface of the carrier bottom, i.e., the surface facing an installed EPIC, to the second surface, which is opposite the first surface and which faces a PCB, when the chip carrier socket is installed. In some embodiments, an optical via passes from the first surface of the carrier bottom to a third surface of the carrier bottom, the third surface being generally orthogonal to the first and second surfaces. Examples of this are seen in FIG. 12, where it can be seen that this third surface is on the outside of a side wall of the carrier bottom. In still other embodiments, an optical via passes from a third surface of the carrier bottom to a fourth surface of the carrier bottom, where the third and fourth surfaces are generally orthogonal to both the first and second surfaces and opposite one another with respect to the enclosed cavity formed by the mating of the carrier top and bottom. In other words, the optical via in these embodiments passes through a side wall in the carrier bottom, e.g., as shown in FIG. 11.

Other embodiments of the inventive devices and assemblies described herein include an assembly comprising any of the chip carrier sockets described above, and further comprising an EPIC assembly, the EPIC assembly being disposed within the enclosed cavity formed by the mating of the carrier top and carrier bottom. In some embodiments, the EPIC assembly disposed within the chip carrier socket comprises two or more integrated-circuit dies bonded to one another so as to form a die stack with first and second primary exterior surfaces corresponding, respectively, to an outer surface of a first one of the integrated-circuit dies and to an outer surface of a second one of the integrated-circuit dies, where at least one of the two or more integrated-circuit dies comprising one or more integrated photonic devices, and a carrier substrate, where one or more channels or passages are formed into the outer surface of the first one of the integrated-circuit dies and where a first surface of the carrier substrate is bonded to the outer surface of the first one of the integrated-circuit dies, thereby enclosing the one or more channels or passages. In these embodiments, each of the two or more integrated-circuit dies is electrically connected to at least one other integrated-circuit die via an electrically conductive through-wafer interconnect or an electrically conductive through-wafer via.

Still other embodiments of the inventive devices and assemblies described herein include a printed circuit board assembly for providing an integrated chip carrier socket for an electronic-photonic integrated-circuit assembly. In some embodiments, the printed circuit board assembly comprises a carrier bottom integrated into a printed circuit board and comprising one or more conductive vias passing from a first surface of the carrier bottom to corresponding electrical traces in or on the printed circuit board, and a carrier top configured to mate to the carrier bottom while enclosing the electronic-photonic integrated-circuit assembly within an enclosed cavity formed by the mating of the carrier top and carrier bottom. In these embodiments, one or both of the carrier bottom and the carrier top comprises a fluid inlet port and a fluid outlet port, the fluid inlet port and fluid outlet port each being configured to allow passage of cooling fluid between the interior and exterior of the enclosed cavity formed by the mating of the carrier top and carrier bottom. Further, one or both of the carrier bottom and the carrier top comprises an optical via passing from one surface to another of the carrier bottom or carrier top. An example of such an embodiment is illustrated in FIG. 12, as discussed above, but any of the various features shown in FIGS. 8-11 may also be adapted to such an integrated embodiment, instead of or in addition to the features specifically illustrated in FIG. 12.

The embodiments described herein address the interconnection and interworking of photonics, electronics, and liquid cooling, between an optical-print circuit board (O-PCB) and a 3D-EPIC chip. The technology described herein is an enabler technology for developing extremely scalable optical PCB (O-PCB) systems that are capable of supporting "die" level IC upgrades, O-PCB hollow waveguide (HW) reuse, and energy efficient liquid immersion cooling for O-PCBs.

Embodiments described herein permit a plurality of 3D-EPICs in "die" form to be populated onto an O-PCB in a very dense 2D/3D configuration, using a compression socket design, with the benefit of using the lowest-cost unpackaged/un-bumped IC form factor. Embodiments may be used to permit a state-of-the-art O-PCB to be upgraded without de-soldering/soldering components from/to the O-PCB, resulting in O-PCB reuse and longevity. Embodiments function as a "bridge" of all signals (electrical and optical) from an O-PCB substrate to the 3D-EPIC die, and incorporates any required parasitic components (capacitors & inductors) simplifying an O-PCB design. The optical "bridging" functions include: mode matching and coarse-to-fine tolerance alignment between an O-PCB and 3D-EPIC, using passive/active beam steering technologies. Another variant of waveguide that can be bridged by the CCS is a "hollow metal waveguide" (HMWG) and "dielectric filled HMWG", which can accommodate photonic, plasmonic, and radio frequency (RF) signaling.

Embodiments enable an O-PCB that comprises an array of 3D-EPICs to be liquid immersion cooled in an inert coolant, using an open loop pump design. In effect, no heavy mechanical structures or high pressure capable plumbing on the O-PCB is required. Some embodiments may integrate replaceable Microelectromechanical systems (MEMS) pumps in the housing of the CCS (in the side walls or in the top), without disturbing the position of the "dies" in the carrier, thus making sub-mean time between failures (MTBF) scheduled preventive maintenance simple.

The flow of the coolant in various embodiments is adaptable for the orientation of the O-PCB (e.g., horizontal or vertical mounting) to maximize thermal & bubble dissipation, permitting the following flow paths: lateral (e.g., sideways or vertical), and transverse (e.g., top-to-side, side-to-top). An integrated low-precision "tilt sensor" in the CCS can permit the fluidic flow paths to be determined autonomously.

The chip carrier sockets described herein are compatible with existing PCB mounting practices, such as: solder reflow or compression fit techniques. In some embodiments, the CCS's bottom "socket" portion can be integrated into the O-PCB fabrication process, minimizing the amount of mounting hardware and post-fabrication assembly work.

It will be appreciated that the above description and the claims appended hereto comprehend methods and devices that vary from the examples specifically illustrated in the attached figures. In particular, it will be appreciated that features from any one of the examples described above may be combined with features from other examples, unless the description or attendant details indicate otherwise. Accordingly, the inventive techniques and devices disclosed herein are not limited to any one or several ones of the specifically described or illustrated examples.

| ABBREVIATIONS | |
|---|---|
| Abbreviation | Explanation |
| 2D | 2 Dimensional |
| 2.5D | 2 Dimensional with low profile traversal in the third dimension |
| 3D | 3 Dimensional |
| BGA | Ball Grid Array |
| CB | Carrier Bottom |

-continued

| ABBREVIATIONS | |
|---|---|
| Abbreviation | Explanation |
| CCS | Chip Carrier Socket |
| CCS-E | Chip Carrier Socket for Microfluidic Cooled EPIC |
| CMOS | Complementary Metal-Oxide-Semiconductor |
| CT | Carrier Top |
| EIC | Electronic Integrated Circuit |
| EPIC | Electronic & Photonic Integrated Circuit |
| Fs | Femtosecond |
| Ge | Germanium |
| IC | Integrated Circuit |
| I/O | Input/Output |
| LGA | Land Grid Array |
| MEMS | Microelectromechanical Systems |
| MTBF | Mean Time Between Failures |
| O-PCB | Optical Printed Circuit Board |
| PCB | Printed Circuit Board |
| PIC | Photonic Integrated Circuit |
| RF | Radio Frequency |
| SOI | Silicon-on-Insulator |
| TCV | Through-Carrier Via |
| TGV | Through-Glass Via |
| TOCV | Through-Optical-Chip Via |
| TSV | Through-Silicon Via |
| TWI | Through-Wafer Interconnect |

What is claimed is:

1. A chip carrier socket for an electronic-photonic integrated-circuit assembly, the chip carrier socket comprising:
a carrier bottom comprising one or more conductive vias passing from a first surface of the carrier bottom to an opposite second surface of the carrier bottom, each of the conductive vias being configured to provide electrical connectivity between an electrically conductive pad on the first surface of the carrier bottom and a respective electrically conductive pad, solder ball, or electrically conductive spring on the second surface of the carrier bottom; and
a carrier top configured to mate to the carrier bottom while enclosing the electronic-photonic integrated-circuit assembly within an enclosed cavity formed by the mating of the carrier top and carrier bottom;
wherein one or both of the carrier bottom and the carrier top comprises a fluid inlet port and a fluid outlet port, the fluid inlet port and fluid outlet port each being configured to allow passage of cooling fluid between the interior and exterior of the enclosed cavity formed by the mating of the carrier top and carrier bottom, and
wherein one or both of the carrier bottom and the carrier top comprises an optical via passing from one surface to another of the carrier bottom or carrier top.

2. The chip carrier socket of claim 1, wherein a conductive contact on the carrier top is configured to engage a corresponding conductive contact on the carrier bottom when the carrier top is mated to the carrier bottom, and wherein the corresponding conductive contact on the carrier bottom is conductively connected to a pad, solder ball, electrically conductive spring, or conductive lead, on or adjacent to the second surface of the carrier bottom.

3. The chip carrier socket of claim 2, wherein the conductive contact on the carrier top comprises a spring-loaded, electrically conductive plug.

4. The chip carrier socket of claim 1, wherein the carrier top comprises a fluid inlet port and a fluid outlet port, the fluid inlet port and fluid outlet port of the carrier top being configured to allow passage of cooling fluid between the interior and exterior of the enclosed cavity formed by the mating of the carrier top and carrier bottom.

5. The chip carrier socket of claim 4, wherein the fluid inlet port and fluid outlet port of the carrier top are arranged to align with corresponding fluid inlet and outlet ports on the electronic-photonic integrated-circuit assembly, when the electronic-photonic integrated-circuit assembly is enclosed within the enclosed cavity formed by the mating of the carrier top and bottom.

6. The chip carrier socket of claim 1, wherein the carrier bottom comprises a fluid inlet port and a fluid outlet port configured to allow passage of cooling fluid between the interior and exterior of the enclosed cavity formed by the mating of the carrier top and carrier bottom.

7. The chip carrier socket of claim 6, wherein the fluid inlet port and fluid outlet port of the carrier bottom are arranged to align with corresponding fluid inlet and outlet ports on the electronic-photonic integrated-circuit assembly, when the electronic-photonic integrated-circuit assembly is enclosed within the enclosed cavity formed by the mating of the carrier top and bottom.

8. The chip carrier socket of claim 1, further comprising a microfluidic pump coupled to the carrier top or carrier bottom and in fluid connection with a fluid inlet port or fluid outlet port.

9. The chip carrier socket of claim 8, wherein the microfluidic pump is replaceably removable from the carrier top or carrier bottom.

10. The chip carrier socket of claim 1, wherein the carrier top comprises an optical via passing from a first surface of the carrier top to a second surface of the carrier top and arranged to couple to an optical port on the electronic-photonic integrated-circuit assembly, when the electronic-photonic integrated-circuit assembly is enclosed within the enclosed cavity formed by the mating of the carrier top and bottom.

11. The chip carrier socket of claim 1, wherein the carrier bottom comprises an optical via passing from one surface of the carrier bottom to another surface of the carrier bottom.

12. The chip carrier socket of claim 11, wherein the optical via passing from one surface of the carrier bottom to another surface of the carrier bottom passes from the first surface of the carrier bottom to the second surface of the carrier bottom.

13. The chip carrier socket of claim 12, wherein the optical via passing from one surface of the carrier bottom to another surface of the carrier bottom passes from the first surface of the carrier bottom to a third surface of the carrier bottom, the third surface being generally orthogonal to the first and second surfaces.

14. The chip carrier socket of claim 12, wherein the optical via passing from one surface of the carrier bottom to another surface of the carrier bottom passes from a third surface of the carrier bottom to a fourth surface of the carrier bottom, wherein the third and fourth surfaces are generally orthogonal to both the first and second surfaces and opposite one another with respect to the enclosed cavity formed by the mating of the carrier top and bottom.

15. An assembly comprising the chip carrier socket of claim 1 and further comprising the electronic-photonic integrated-circuit assembly, the electronic-photonic integrated-circuit assembly being disposed within the enclosed cavity formed by the mating of the carrier top and carrier bottom.

16. The assembly of claim 15, wherein the electronic-photonic integrated-circuit assembly comprises:
 two or more integrated-circuit dies bonded to one another so as to form a die stack with first and second primary exterior surfaces corresponding, respectively, to an outer surface of a first one of the integrated-circuit dies and to an outer surface of a second one of the integrated-circuit dies, at least one of the two or more integrated-circuit dies comprising one or more integrated photonic devices; and
 a carrier substrate;
 wherein one or more channels or passages are formed into the outer surface of the first one of the integrated-circuit dies, and wherein a first surface of the carrier substrate is bonded to the outer surface of the first one of the integrated-circuit dies, thereby enclosing the one or more channels or passages; and
 wherein each of the two or more integrated-circuit dies is electrically connected to at least one other integrated-circuit die via an electrically conductive through-wafer interconnect or an electrically conductive through-wafer via.

17. A printed circuit board assembly for providing an integrated chip carrier socket for an electronic-photonic integrated-circuit assembly, the printed circuit board assembly comprising:
 a carrier bottom integrated into a printed circuit board and comprising one or more conductive vias passing from a first surface of the carrier bottom to corresponding electrical traces in or on the printed circuit board; and
 a carrier top configured to mate to the carrier bottom while enclosing the electronic-photonic integrated-circuit assembly within an enclosed cavity formed by the mating of the carrier top and carrier bottom;
 wherein one or both of the carrier bottom and the carrier top comprises a fluid inlet port and a fluid outlet port, the fluid inlet port and fluid outlet port each being configured to allow passage of cooling fluid between the interior and exterior of the enclosed cavity formed by the mating of the carrier top and carrier bottom, and
 wherein one or both of the carrier bottom and the carrier top comprises an optical via passing from one surface to another of the carrier bottom or carrier top.

* * * * *